(12) United States Patent
Park et al.

(10) Patent No.: US 7,065,900 B2
(45) Date of Patent: Jun. 27, 2006

(54) DOCKING-TYPE SYSTEM AND METHOD FOR TRANSFERRING AND TREATING SUBSTRATE

(75) Inventors: Yong-Seok Park, Seoul (KR); Kyung-Chul Kim, Seoul (KR); Sok-Joo Lee, Yongin (KR)

(73) Assignee: DMS Co., Ltd., Kyungki-Do (KR)

( * ) Notice: Subject to any disclaimer, the term of this patent is extended or adjusted under 35 U.S.C. 154(b) by 0 days.

(21) Appl. No.: 10/852,965

(22) Filed: May 25, 2004

(65) Prior Publication Data

US 2005/0000110 A1    Jan. 6, 2005

(30) Foreign Application Priority Data

Jul. 2, 2003    (KR)    ............... 10-2003-0044490

(51) Int. Cl.
*F26B 3/08* (2006.01)
(52) U.S. Cl. ............................................. 34/361; 34/68
(58) Field of Classification Search ................ 34/61, 34/68, 630, 189, 210, 236, 329, 361, 406; 134/61, 902; 414/225.01, 9
See application file for complete search history.

(56) References Cited

U.S. PATENT DOCUMENTS

| 4,923,584 | A | * | 5/1990 | Bramhall et al. | ...... 204/298.25 |
|---|---|---|---|---|---|
| 5,934,856 | A | * | 8/1999 | Asakawa et al. | ............ 414/217 |
| 5,972,184 | A | * | 10/1999 | Hollars et al. | ......... 204/298.09 |
| 5,979,475 | A | * | 11/1999 | Satoh et al. | ................. 134/140 |
| 6,254,739 | B1 | * | 7/2001 | Fan | ........................ 204/192.15 |
| 6,330,755 | B1 | * | 12/2001 | Kato et al. | ..................... 34/406 |
| 6,485,988 | B1 | * | 11/2002 | Ma et al. | ........................ 438/3 |
| 6,635,528 | B1 | * | 10/2003 | Gilbert et al. | .............. 438/253 |
| 6,712,577 | B1 | * | 3/2004 | Davis et al. | ................. 414/217 |

OTHER PUBLICATIONS

Graninger, W. B., et al., "One-Year Inhibition of Tumor Necrosis Factor-Alpha: A Major Success or a Larger Puzzle?" *Curr Opin Rheumatol*, 13(3): 209-213 (2001).
Shaw, T., et al., "Metalloproteinase Inhibitors: New Opportunities for the Treatment of Rheumatoid Arthritis and Osteoarthritis," *Expert Opin. Investig. Drugs*, 9(7): 1469-1478 (2000).

* cited by examiner

*Primary Examiner*—S. Gravini
(74) *Attorney, Agent, or Firm*—Marshall, Gerstein & Borun LLP

(57) ABSTRACT

A substrate transferring/treating system includes a substrate stacking base, a substrate transferring member for receiving/transferring the substrate from/to the base, a substrate cleaning/drying device for cleaning and drying the substrate transferred from the substrate transferring member, and a substrate treating device for treating the substrate that is cleaned and dried by the substrate cleaning/drying device and transferred by the substrate transferring member.

10 Claims, 6 Drawing Sheets

DOCKING-TYPE SYSTEM AND METHOD FOR TRANSFERRING AND TREATING SUBSTRATE

BACKGROUND OF THE DISCLOSURE

1. Field of the Disclosure

The disclosure relates to a system and method for transferring and treating a substrate, and more particularly, to a system and method for transferring and treating a substrate which can improve the substrate transferring/treating efficiency by interconnecting treating, cleaning, and drying lines in a docking-type system.

2. Description of the Related Art

Generally, a substrate used for a flat panel display (FPD), a semiconductor wafer, a liquid crystal display (LCD), a photo mask glass, and the like are treated while going through depositing, etching, stripping, cleaning, and rinsing processes.

Such a series of processes are performed in association with a transfer system to define a circulation cycle formed with feeding, treating, and dispensing processes. The transfer system generally includes a manual guarded vehicle (MGV), an auto guarded vehicle (AGV) and a clean transfer vehicle (CVT).

The substrate transfer system is associated with the treating processes in a variety of methods.

That is, the substrate transfer system feeds the substrate from the cleaning line to a cassette, and transfers the substrate stored in the cassette to a vacuum evaporation depositing device or a sputtering device. The substrate transfer system further transfers the substrate treated in the vacuum evaporation deposition device or the sputtering device to the cassette and feeds the substrate stored in the cassette to the etching device.

Alternatively, the substrate transfer system feeds the substrate to the cassette. A zenith carrier transfers the substrate stored in the cassette to an adjacent cassette. The substrate stored in the adjacent cassette is further fed to the substrate treating line.

However, such a substrate transferring/treating system has a variety of drawbacks, as follows.

1. Since a number of substrate treating lines are independently arranged and a number of transferring devices are disposed between the substrate treating lines, transferring, storing, and withdrawing processes should be repeatedly performed for the treating lines, causing the transferring time to be retarded.

2. Since parts of the substrate transferring/treating system, such as a loader, a depositing part, an etching part, a rinsing part, a stripping part, a cleaning part, and an unloader are independently provided, a relatively large installing space is required, increasing the equipment costs.

3. Since the transferring of the substrate is realized by a conveying device such as the MGV, AGV, and CVT, the substrate treatment efficiency is deteriorated.

4. Since the system is exposed to an external environment, the substrate may be contaminated during the transferring process.

SUMMARY OF THE INVENTION

The disclosure has been made in an effort to solve the above-described drawbacks.

In one embodiment, the disclosure provides a system and method for transferring and treating a substrate, which can improve the substrate transferring/treating efficiency by interconnecting treating, cleaning, and drying lines in a docking type system.

In a second embodiment, the disclosure provides a system and method for transferring and treating a substrate, which can save costs for installing treating lines by arranging cleaning and drying lines in a stacking structure and densely disposing cleaning units while preventing the cleaning units from interfering with each other.

In a third embodiment, the disclosure provides a system and method for transferring and treating a substrate, which has a cleaning and drying devices formed in an enclosed in-line structure, thereby preventing the substrate from being contaminated.

To achieve the above objectives, the disclosure provides a substrate transferring/treating system comprising a substrate stacking base; a substrate transferring member for receiving/transferring the substrate from/to the base; a substrate cleaning/drying device for cleaning and drying the substrate transferred from the substrate transferring member; and a substrate treating device for treating the substrate that is cleaned and dried by the substrate cleaning/drying device and transferred by the substrate transferring member.

According to another aspect of the disclosure, there is provided a substrate treating method comprising the steps of unloading the substrate from a substrate stacking base; transferring the substrate to a substrate cleaning/drying device that is connected in a docking type system; and transferring the substrate treated by the substrate cleaning/drying device to a substrate treating device.

BRIEF DESCRIPTION OF THE DRAWINGS

The accompanying drawings, which are included to provide a further understanding of the disclosure and are incorporated herein, illustrate embodiment(s) of the disclosure, and together with the description serve to explain the principle of the disclosure. In the drawings.

DETAILED DESCRIPTION OF THE PREFERRED EMBODIMENTS

A preferred embodiment of the disclosure will be described more in detail hereinafter in conjunction with the accompanying drawings.

Figure 1:
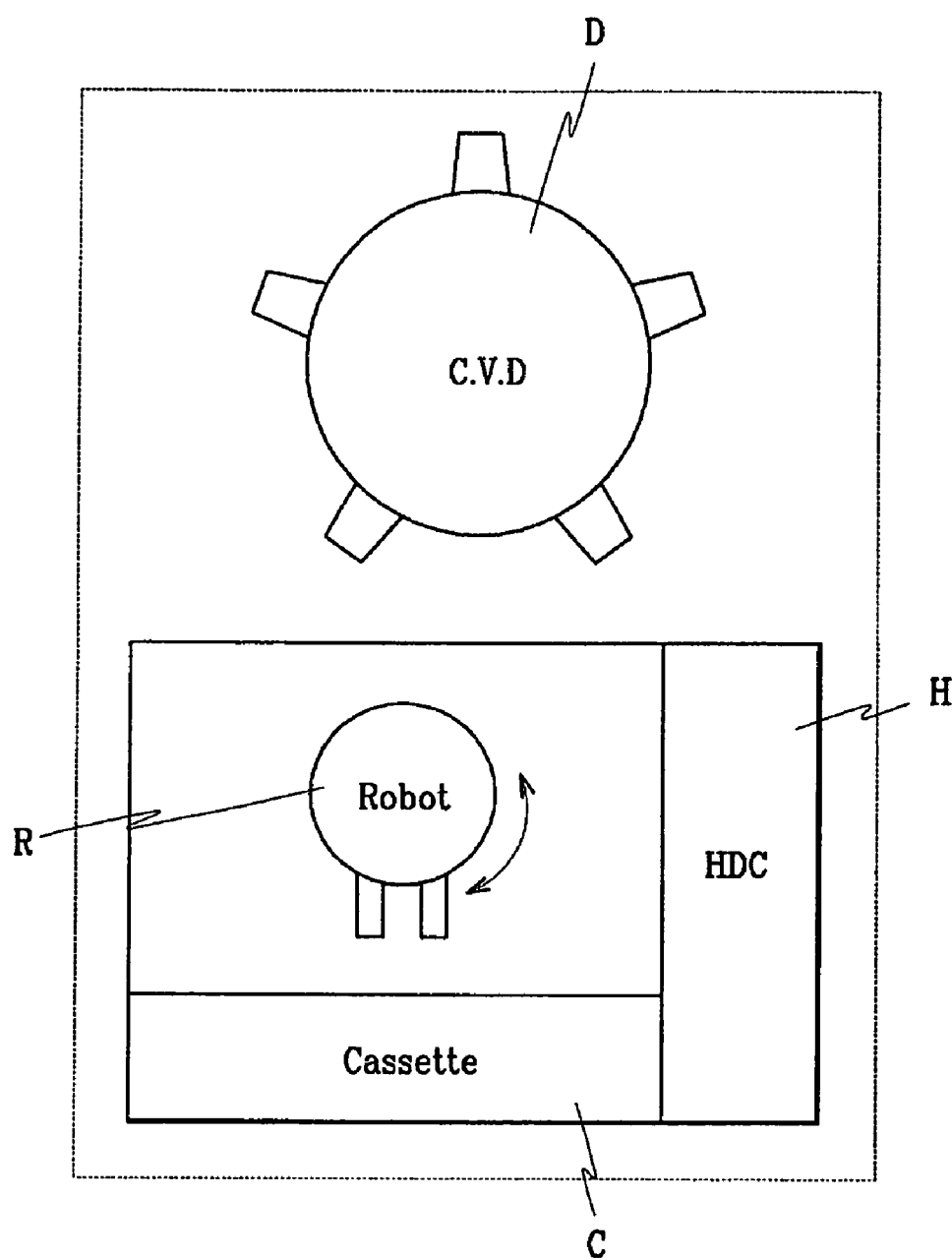
FIG. 1 is a schematic view of a docking-type system for transferring and treating a substrate according to a preferred embodiment of the disclosure.

FIG. 1 shows a docking-type system for transferring and treating a substrate according to a preferred embodiment of the disclosure.

As shown in the drawings, the disclosure system comprises a substrate-piling base C, a substrate-transferring member R for feeding/withdrawing the substrate to/from the substrate-piling base C, a substrate cleaning/drying device H for cleaning and drying the substrate by feeding/withdrawing the substrate to/from the substrate-transferring member R, and a substrate-treating device D for treating the substrate fed from the substrate cleaning/drying device H by the substrate-transferring member R.

The substrate-piling base C may include a cassette in/from which a plurality of substrates are stacked or withdrawn.

The transferring member R may include a robot, being provided with an arm for piling up the substrates. That is, the transferring member R may be a kind of robot that is capable of rotating and elevating. Accordingly, the transferring member R withdraws the substrate from the cassette C and supplies the same to the cleaning and drying lines, or operates in a reverse order.

Preferably, the substrate-treating device D is selected from one of a chemical vapor deposition device and a sputtering device. That is, the substrate-treating device D is designed to deposit a predetermined layer on the substrate. However, the substrate-treating device D is not limited to the above.

As described above, the substrate transferring/treating system is designed such that a series of processes including withdrawing, cleaning, drying, and vacuum-treating processes are realized in an identical place, improving the substrate transferring/treating efficiency.

The substrate cleaning/drying device H will be described more in detail in conjunction with FIGS. 2 through 5.

As shown in the drawings, the substrate cleaning/drying device H comprises a frame 10, an upper transferring member 12 slidably mounted on the frame 10 to receive/transfer the substrate A from/to the robot R, vertical transferring members 14 and 16 respectively mounted on front and rear ends of the frame 10 to receive/transfer the substrate A from/to the upper transferring member 12, transferring units 18 and 20 functioning to receive/transfer the substrate A from/to the vertical transferring members 14 and 16, and a substrate-treating unit 22 disposed between the transferring units 18 and 20 to clean and dry the substrate A.

The frame 10 is formed in a plurality of levels, preferably three. That is, the frame 10 includes an upper level III on which the upper transferring member 12 for transferring the substrate A in a horizontal direction is disposed, a middle level II on which the substrate-treating unit 22 is disposed, and a lower level I on which a supporting member and driving members are disposed.

Accordingly, since the substrate transferring member and the substrate-treating unit are disposed in a stacked state, the size of the system can be minimized. That is, the substrate transferring, cleaning, and drying processes are effectively realized in a limited space.

The frame may be enclosed by a panel except for the substrate inlet and outlet portions in order to prevent alien substances from entering.

The upper transferring member 12 comprises a lower base 13 slidably disposed on rails 24 mounted on both longitudinal side ends of the frame 10, an upper base 15 mounted on the lower base to receive the substrates A, aligning parts 26 mounted on the upper base 15 to align the substrates A, and a plurality of rising plates 28 for raising the substrates A to a predetermined height.

Disposed on the rails 24 are sliding plates 17 that are designed to move along the rails 24 by a motor (not shown) so as to longitudinally move the transferring member 12.

In addition, a plurality of support pins 27 are further mounted on the upper base 15. Accordingly, the substrate A can be stably seated on the aligning parts 26 and the support pins 27. At this point, guide pins 29 are projected upward from the aligning parts 26. That is, the guide pins 29 functions to fix corners of the substrate A at predetermined locations. Accordingly, the substrate A can be accurately positioned at a specific location of the aligning parts 26.

Furthermore, the rising plates 28 are provided to prevent the substrate A from sagging. That is, a predetermined pressure of air is injected toward the rising plates 28 to hold the bottom of the rising plates 28 up.

In addition, a rotational member 49 such as a motor may be selectively mounted between the lower and upper bases 13 and 15. That is, the rotational member 49 is fixed on the top of the lower base 13 and the upper base 15 is mounted on the top of the rotational member 49.

Accordingly, by the rotational member 49, the base 15 can be rotated by a predetermined angle if required to thereby properly adjust the transferring direction of the substrate A.

Meanwhile, the vertical transferring members 14 and 16 are respectively formed of first and second up-down buffer units for transferring/receiving the substrate A to/from the upper transferring member 12.

That is, the first up-down buffer unit 14 is elevatably mounted on a side of the frame 10 to receive the substrate A from the upper transferring member 12. The second up-down buffer unit 16 is elevatably mounted on another side of the frame 10, which is opposite to the first up-down buffer unit 14, to transfer the substrate A to the upper transferring member 12.

Since the first and second up-down buffer units 14 and 16 have an identical structure to each other, only one of them will be described hereinafter.

The buffer unit 14 comprises a pair of upper holders 30 receiving the substrate A from the transferring member 12 and descending, and a lower holder 32 receiving the substrate A from the upper holders 30 and transferring the substrate A to the loader 18.

The upper holders 30 are formed in a ]-shape, and are designed to horizontally and vertically move by the motor 31.

That is, when the upper holders 30 receive the substrate A from the upper transferring member 12, they move downward. After transferring the substrate A to the lower holder 32, the upper holders 30 horizontally move for preparing for the descending operation.

The lower holder 32 is also formed in a ]-shape, and is designed to vertically move by the motor 33. The substrate A from the upper holders 30 is seated on the top of the lower holder 32.

The upper and lower holders 30 and 32 have a buffer function for reducing tack time. That is, the substrates stand by at the lower holder 32 to be successively transferred to the loader 18.

In addition, when the lower holder 32 on which the substrate A is seated descends to be lower than a substrate passing line (P/S) of the loader 18, the substrate A is seated on the loader 18 to be successively treated. Accordingly, the substrate A transferred by the upper and lower holders 30 and 32 is transferred to the substrate treating unit 22 by the loader 18.

Meanwhile, the loader 18 is disposed at an upstream side of the substrate treating unit 22 to transfer the substrate A into the substrate treating unit 22. The loader 18 comprises a plurality of returning rollers 36 rotatable by the motor. By the rotation of the returning rollers 36, the substrate A fed from the first up-down buffer unit 14 is transferred to the substrate treating unit 22.

The unloader 37 is disposed on a downstream side 42 of the substrate treating unit 22, having an identical structure to that of the loader 18.

Accordingly, the substrate A transferred from the substrate treating unit 22 is transferred by the returning roller 20 to the second up-down buffer unit 16.

Meanwhile, the substrate treating unit 22 treats the substrate A transferred by the loader 18 through a series of processes such as a cleaning process, a drying process, and the like, and it is then removed by the unloader 37.

The substrate treating unit 22 includes an organic cleaning module 44, a cleaning module 46 for cleaning the organic substrate A, and a drying module 48 for drying the cleaned substrate A.

The cleaning module 46 is comprised of cleaning units such as an air curtain, an air suction unit, a roller brush and shower, a deionized water jet, and an air knife. The cleansing module 46 is designed to apply physical energy to the deionized water jet, the air knife, and the like. The cleaning units are densely arranged, but they do not interfere with each other. A single substrate is treated by the plural cleaning units.

The organic cleaning module 44 is not essential, and it can be omitted if required.

The operation of the above-described substrate transferring/treating system and the method for treating the substrate using the same will be described hereinafter.

Figure 2:
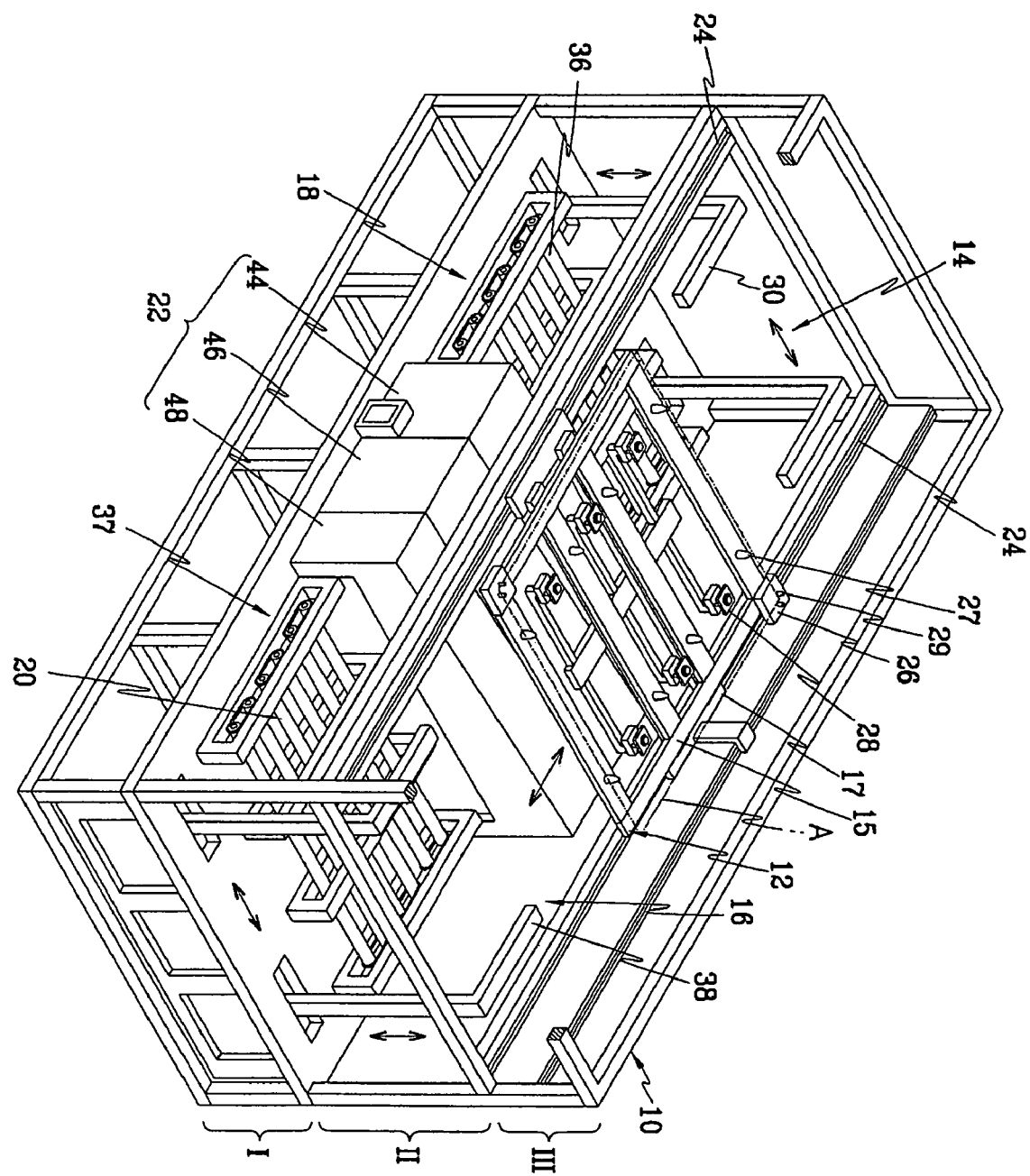
FIG. 2 is a perspective view of substrate cleaning and drying devices depicted in FIG. 1.
Figure 3:
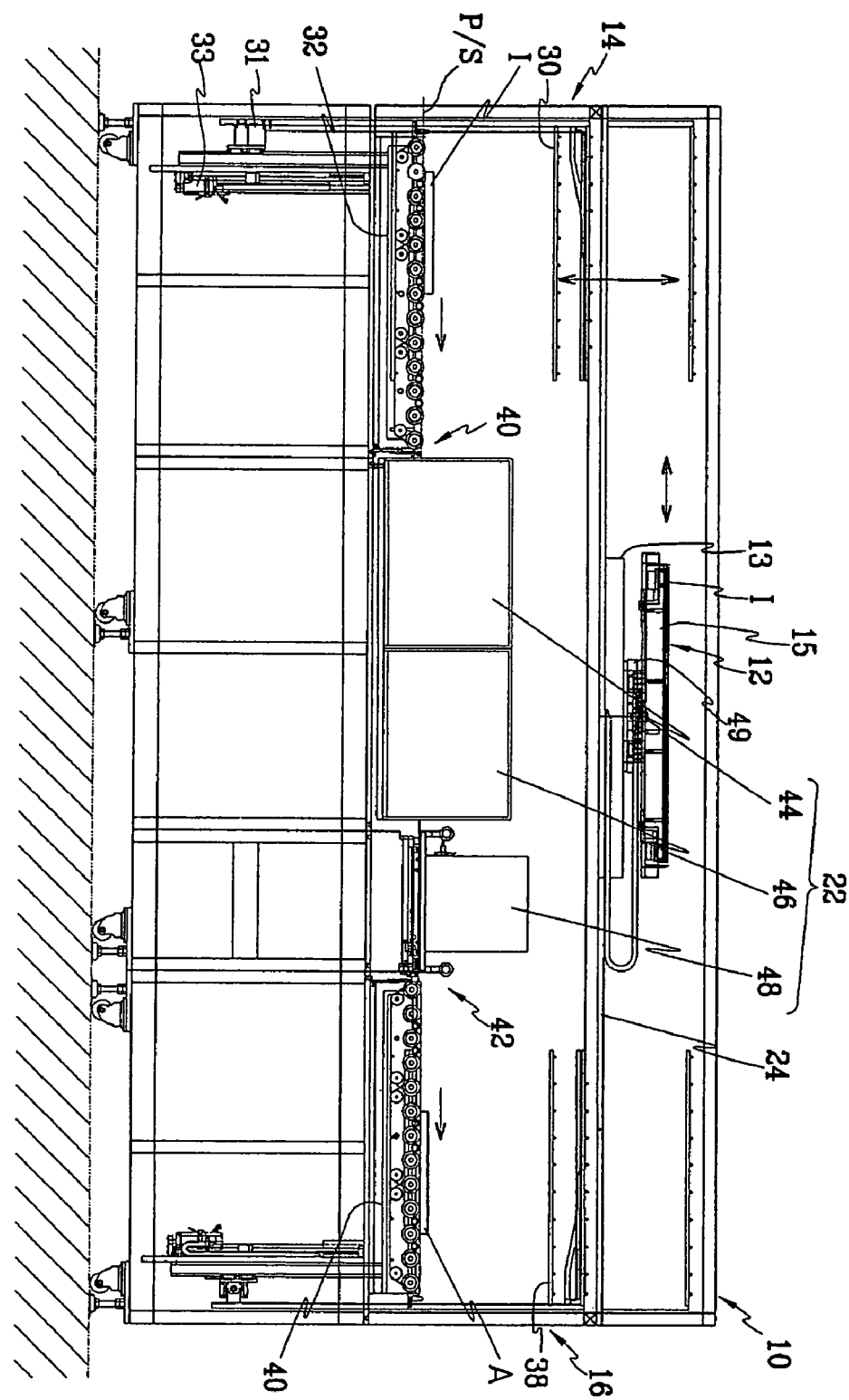
FIG. 3 is a side view of substrate cleaning and drying devices depicted in FIG. 2.
Figure 4:
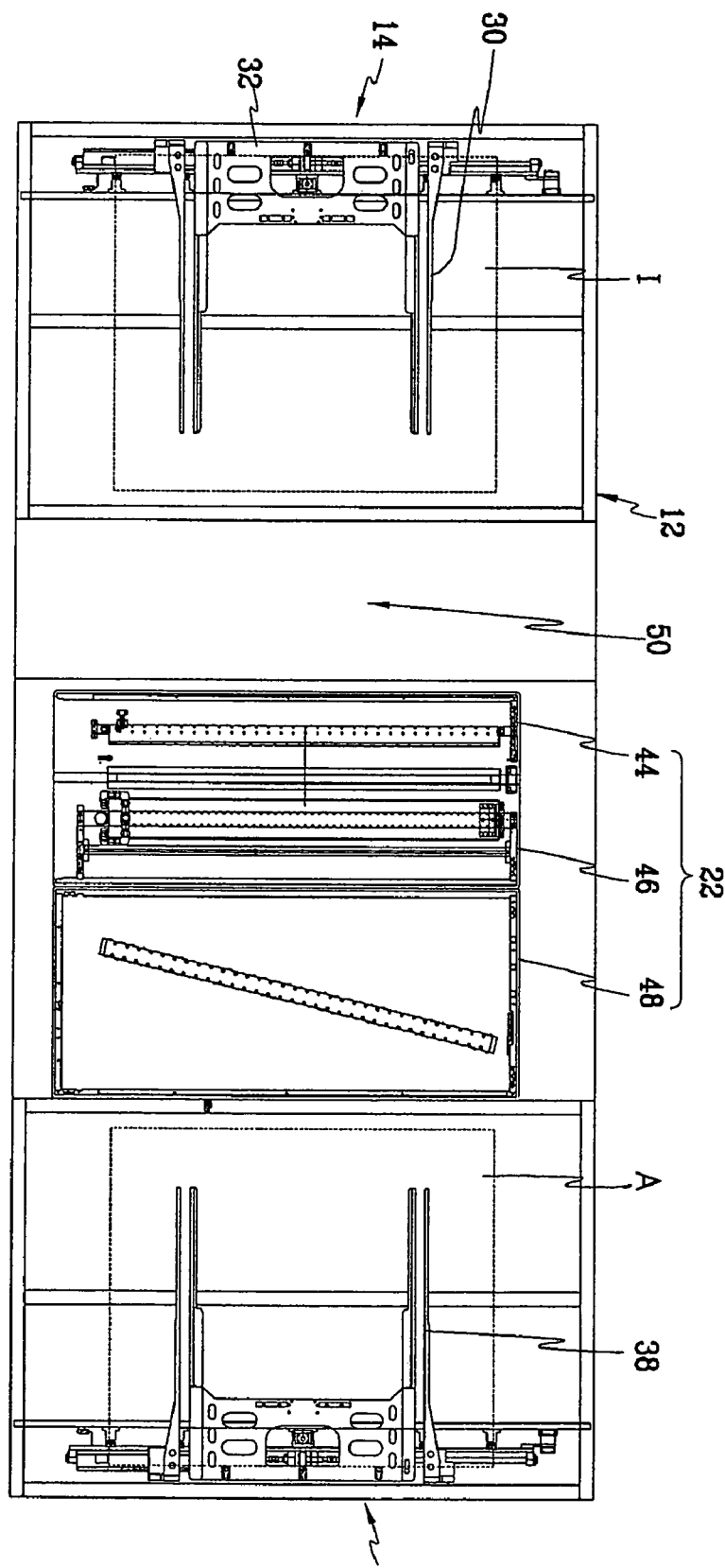
FIG. 4 is a plane view of substrate cleaning and drying devices depicted in FIG. 2.
Figure 5:
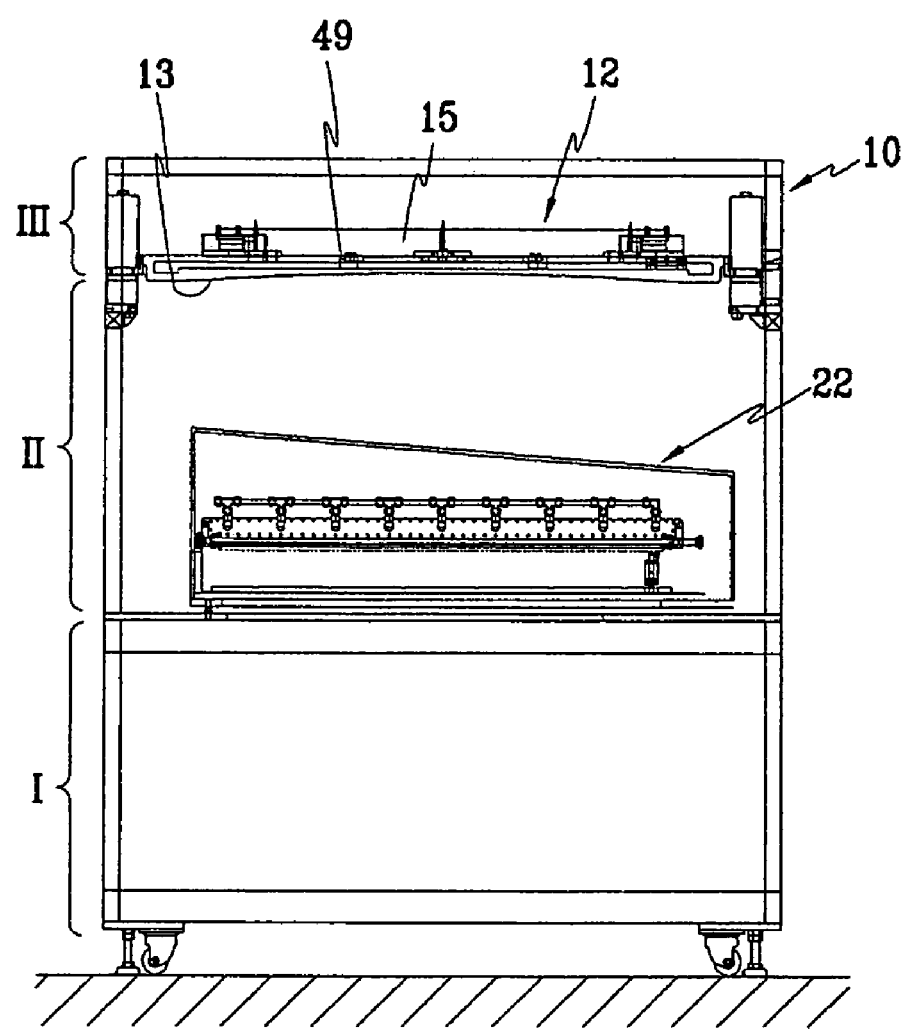
FIG. 5 is a right side view of substrate cleaning and drying devices depicted in FIG. 2.
Figure 6:
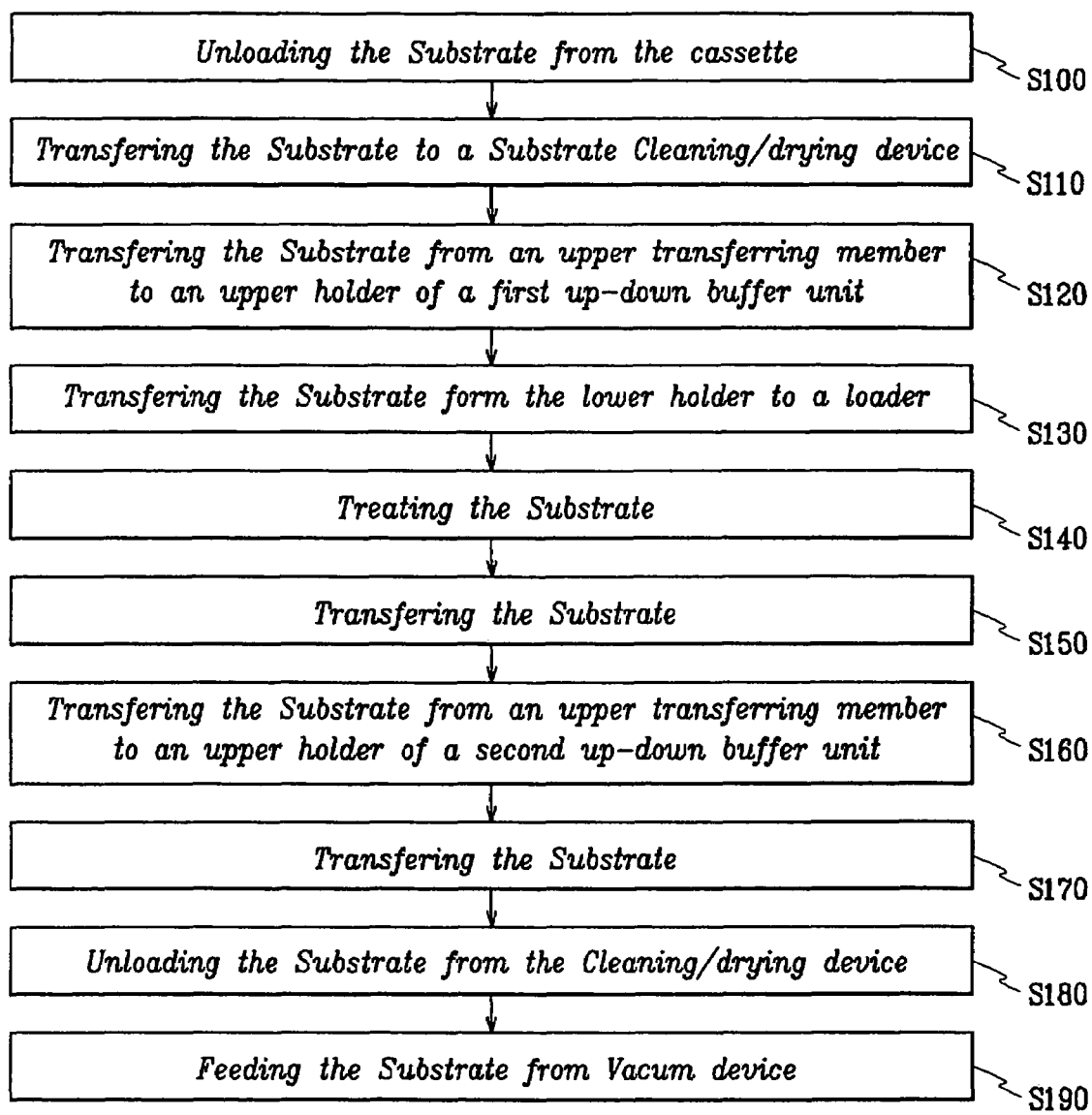
FIG. 6 is a flowchart illustrating a method for transferring and treating a substrate according to a preferred embodiment of the present invention.

As shown in FIGS. 1 and 2 and FIG. 6, the robot R unloads the substrate A from the cassette C (S100). That is, the arm of the robot R is advanced into the cassette C to unload the substrate A from the cassette C.

After unloading the substrate A, the robot R rotates to a predetermined angle and ascends to a predetermined height to transfer the substrate A to the substrate cleaning/drying device H (S 110).

The upper transferring member 12 is disposed at a location for receiving the substrate to receive the substrate A from the robot R. The substrate A is aligned on the aligning part 26 of the upper transferring member 12. When the substrate A is aligned, the transferring member 12 moves forward by the motor (not shown).

When the transferring member 12 reaches a predetermined location, the first up-down unit receives the substrate from the transferring member 12 (S120).

That is, when the upper transferring member 12 reaches a predetermined location, the upper holder 30 of the first up-down buffer unit 14 ascends to a predetermined level and stands by thereon. When the substrate A is transferred, the first up-down buffer unit 14 further ascends a small amount to lift the substrate A upward and take over the substrate from the upper transferring member 12.

The upper holder 30 receiving the substrate A descends to a predetermined level. At this point, the lower holder 32 stands by at a predetermined height.

When the upper holder 30 reaches a predetermined location, the lower holder 32 ascends a small amount to receive the substrate A from the upper holder 30. The upper holder 30 moves in the horizontal direction to allow the lower holder 32 to move downward.

After receiving the substrate A, the lower holder 32 descends to a location lower than the substrate pass line P/S of the loader 18. Accordingly, the substrate A loaded on the lower holder 32 is separated from the lower holder 32 and is loaded on the returning rollers 36 of the loader 18.

By the above-described process, the substrate A is transferred to the loader 18 via the upper and lower holders 30 and 32.

The substrate A is further transferred by the loader 18 (S130). That is, when the substrate A is loaded on the returning rollers 36, the returning rollers 36 rotate by the motor so that the substrate A can be transferred to the substrate treating unit 22.

The substrate A transferred to the substrate treating unit 22 is cleaned and dried through a series of processes (S140).

That is, the substrate is selectively dry-cleaned by the organic cleaning module 44, and is further cleaned while going through the deionized water jet and the air knife. The substrate A passing through the cleaning module 46 is further transferred to the dry module 48.

The substrate A passing through the substrate treating unit 22 is dispensed by the returning roller 20 of the unloader 37 (S510). The dispensed substrate is further transferred by the second up-down buffer unit 16.

That is, the substrate is loaded on the lower holder 32 of the second up-down buffer unit 16. The substrate A loaded on the lower holder 32 ascends to a predetermined level to be taken over to the upper holder 30.

The upper holder 30 taking over the substrate A ascends to a predetermined height to reach the upper level III. The substrate A is taken over to the upper transferring member 12 at the upper level III (S170). The upper transferring member 12 receiving the substrate A is moved to a predetermined location to have the substrate A taken over by the robot R (S180).

The robot R receiving the substrate A descends and rotates to a predetermined angle to feed the substrate A to the substrate treating device D (S190). Accordingly, the substrate A fed to the substrate treating device D is treated by the chemical vapor deposition device or sputtering device.

As described above, the substrate A is withdrawn from the cassette C by the robot R and fed to the substrate cleaning/drying device H. The substrate A is then transferred to the upper transferring member 12 and it is returned to the upper transferring member 12 via the first up-down buffer unit 14, the loader 18, the substrate treating unit 22, the unloader 37, and the second up-down buffer unit 16. The substrate A returned to the upper transferring member 12 is fed to the substrate treating device D by the robot R to go through a series of treating processes.

In the above description, although the vacuum treatment is performed after the cleaning/drying treatment, the disclosure is not limited to this. That is, the system can be designed such that the vacuum treatment can be performed prior to the cleaning/drying treatment.

In addition, while the system is illustrated as a docking type, the disclosure is not limited to this. That is, the system can be associated with other apparatus such as an in-line type.

According to the disclosure, since the cleaning and drying devices are arranged as a docking type system, the space saving efficiency can be improved, reducing the investment costs.

In addition, the substrate cleaning and drying device is formed as an in-line type with an enclosed structure, alien substances cannot be infiltrated into the system, reducing defects of the substrate.

It will be apparent to those skilled in the art that various modifications and variations can be made in the disclosure. Thus, it is intended that the disclosure covers the modifications and variations of this invention provided they come within the scope of the appended claims and their equivalents.

What is claimed is:

1. A substrate transferring and treating system comprising:
   a substrate stacking base; and
   a substrate transferring member that transfers a substrate from said base to a substrate cleaning/drying device, and the same substrate transferring member transfers said substrate from said cleaning/drying device to a substrate treating device;
   wherein said substrate cleaning/drying device cleans and dries the substrate and
   wherein said substrate treating device treats the substrate.

2. The substrate transferring and treating system of claim 1, wherein the substrate transferring member comprises an arm for loading the substrate, and a robot that is rotatable and elevatable.

3. The substrate transferring and treating system of claim 1, wherein the substrate treating device is one of a chemical vapor deposition device and a sputtering device.

4. The substrate transferring and treating system of claim 1, wherein the substrate cleaning/drying device comprises:
   a frame having multiple levels;
   an upper transferring member disposed on one of the levels that horizontally transfers the substrate;
   a vertical transferring member elevatably mounted on the frame that vertically receives and transfers the substrate;
   a transferring unit disposed on another one of the levels that transfers the substrate to the vertical transferring member and receives the substrate from the vertical transferring member, and
   a substrate treating unit that cleans and dries the substrate.

5. The substrate transferring and treating system of claim 4, wherein the upper transferring member comprises:
   a lower base disposed on rails installed on the frame;
   an upper base mounted on the lower base for stacking the substrate; and
   an aligning part on which the substrate is seated.

6. The substrate transferring and treating system of claim 4, wherein the vertical transferring member comprises:
   an upper holder movable in horizontal and vertical directions to transfer the substrate to the upper transferring member and receive the substrate from the upper transferring member; and
   a lower holder that transfers the substrate from the upper holder to the transferring unit and transfers the substrate from the transferring unit to the upper holder.

7. The substrate transferring and treating system of claim 4, wherein the transferring unit comprises:
   a loader for transferring the substrate from the vertical transferring member to the substrate treating unit; and
   an unloader for unloading the substrate from the substrate treating unit.

8. The substrate transferring and treating system of claim 7, wherein the vertical transferring member comprises:
   a first up-down buffering unit disposed on a front side of the frame to transfer the substrate from the upper transferring member to the loader; and
   a second up-down buffering unit disposed on a rear side of the frame to transfer the substrate transferred from the unloader to the upper transferring member.

9. A substrate treating method comprising the steps of:
   unloading the substrate out of a substrate stacking base with a substrate transferring member;
   transferring the substrate to a substrate cleaning/drying device with the same substrate transferring member; and
   transferring the substrate from said substrate cleaning/drying device to a substrate treating device with the same substrate transferring member,
   wherein the cleaning/drying device is connected in a docking type system to the substrate treating device.

10. The substrate treating method of claim 9, wherein the step of transferring the substrate to a substrate cleaning/drying device comprises the steps of:
    transferring the substrate from an upper transferring member to an upper holder of a first up-down buffer unit;
    transferring the substrate from the upper holder to the lower holder:
    transferring the substrate from the lower holder to a loader;
    cleaning/drying the substrate fed from the loader;
    transferring the cleaned and dried substrate to a lower holder of a second up-down buffer unit;
    transferring the substrate from the lower holder to the upper holder;
    transferring the substrate from the upper holder of the second up-down buffer unit to the upper transferring member; and
    transferring the substrate from the upper transferring member to the substrate transferring member.

* * * * *